United States Patent [19]
Wakita

[11] Patent Number: 5,857,164
[45] Date of Patent: Jan. 5, 1999

[54] SYSTEM FOR CALCULATING CURRENT CONSUMPTION CHARACTERISTICS OF CELLS

[75] Inventor: Makoto Wakita, Kasugai, Japan

[73] Assignee: Fujitsu Limited, Kawasaki, Japan

[21] Appl. No.: 805,760

[22] Filed: Feb. 25, 1997

[30] Foreign Application Priority Data

Apr. 12, 1996 [JP] Japan .................................. 8-091401

[51] Int. Cl.$^6$ ................................................. G06F 17/50
[52] U.S. Cl. ........................... 702/64; 364/489; 364/490; 364/578
[58] Field of Search .................................. 364/483, 488, 364/489, 490, 491, 573, 578; 702/117, 64; 365/201, 205

[56] References Cited

U.S. PATENT DOCUMENTS

| | | | |
|---|---|---|---|
| 4,763,289 | 8/1988 | Barzilai et al. | 364/578 |
| 5,189,589 | 2/1993 | Marschall | 361/93 |
| 5,557,582 | 9/1996 | Kawamoto | 365/233.5 |
| 5,668,732 | 9/1997 | Khouja et al. | 364/483 |
| 5,677,856 | 10/1997 | Tani | 364/457 |
| 5,682,320 | 10/1997 | Khouja et al. | 364/489 |

Primary Examiner—James P. Trammell
Assistant Examiner—Demetra R. Smith
Attorney, Agent, or Firm—Staas & Halsey

[57] ABSTRACT

A system and method for calculating current consumption characteristics of cells of semiconductor circuits is disclosed. According to the invention, the current consumption characteristics of the cells is calculated based on the status changes of the internal memories of the cells. The calculation of current consumption characteristics of cells according to the invention is not only more accurate, but also more efficient in terms of the time needed for logic simulation.

10 Claims, 7 Drawing Sheets

| D | CK | M1 | M2 | Q | XQ | D | CK | M1 | M2 | Q | XQ |
|---|----|----|----|---|----|---|----|----|----|---|-----|
| 0 | 0  | L  | L  | H | L  | 0 | 1  | L  | H  | L | H  |
| 0 | 0  | L  | L  | H | L  | 1 | 0  | H  | L  | H | L  |
| 0 | 0  | L  | L  | H | L  | 0 | 0  | L  | H  | L | H  |
| 0 | 0  | L  | H  | L | H  | 0 | 1  | L  | H  | L | H  |
| 0 | 0  | L  | H  | L | H  | 1 | 0  | H  | H  | L | H  |
| 0 | 0  | L  | H  | L | H  | 0 | 0  | L  | H  | L | H  |
| 0 | 1  | L  | H  | L | H  | 0 | 0  | L  | H  | L | H  |
| 0 | 1  | L  | H  | L | H  | 1 | 1  | L  | H  | L | H  |
| 0 | 1  | L  | H  | L | H  | 0 | 1  | L  | H  | L | H  |
| 0 | 1  | H  | L  | H | L  | 0 | 0  | L  | L  | H | L  |
| 0 | 1  | H  | L  | H | L  | 1 | 1  | H  | L  | H | L  |
| 0 | 1  | H  | L  | H | L  | 0 | 1  | L  | H  | L | H  |
| 1 | 0  | H  | L  | H | L  | 1 | 1  | H  | L  | H | L  |
| 1 | 0  | H  | L  | H | L  | 0 | 0  | L  | L  | H | L  |
| 1 | 0  | H  | L  | H | L  | 1 | 0  | H  | H  | L | H  |
| 1 | 0  | H  | H  | L | H  | 1 | 1  | H  | L  | H | L  |
| 1 | 0  | H  | H  | L | H  | 0 | 0  | L  | H  | L | H  |
| 1 | 0  | H  | H  | L | H  | 1 | 0  | H  | H  | L | H  |
| 1 | 1  | L  | H  | L | H  | 1 | 0  | H  | H  | L | H  |
| 1 | 1  | L  | H  | L | H  | 0 | 1  | L  | H  | L | H  |
| 1 | 1  | L  | H  | L | H  | 1 | 1  | L  | H  | L | H  |
| 1 | 1  | H  | L  | H | L  | 1 | 0  | H  | L  | H | L  |
| 1 | 1  | H  | L  | H | L  | 0 | 1  | H  | L  | H | L  |
| 1 | 1  | H  | L  | H | L  | 1 | 1  | L  | H  | L | H  |

33B ← second row; 33C ← third row

| A | B | X1 |
|---|---|----|
| 1 | 1 | 0  |
| 1 | 0 | 1  |

| E | F | G | X3 |
|---|---|---|----|
| 1 | 0 | 1 | 0  |
| 1 | 0 | 0 | 1  |

SYSTEM FOR CALCULATING CURRENT CONSUMPTION CHARACTERISTICS OF CELLS

BACKGROUND OF THE INVENTION

1. Field of the Invention

The present invention relates generally to a system for calculating current consumption characteristics of cells, such systems being used to design the layout of semiconductor integrated circuits. More particularly, this invention relates to a system for calculating current consumption characteristics of cells that takes into consideration the status change of an internal memory cell.

2. Description of the Related Art

There are apparatuses that compute power consumption based on logic simulations of semiconductor circuits in order to ensure low power consumption. As is well known, low power consumption has become necessary as integration and operation speeds of semiconductor circuits have become higher and faster. These conventional apparatuses are used to compute operational power consumption of a plurality of cells constituting a semiconductor circuit based on previously prepared current consumption characteristics of each cell in the development stage of the semiconductor circuit. Generally, the current consumption characteristics of each cell are provided by a cell characteristic calculating unit. The cell characteristic calculating unit computes the current consumption characteristics of each cell in accordance with a plurality of input terminal conditions. These input terminal conditions indicate changes in an input signal in a path which has an input terminal for receiving an input signal and an output terminal for outputting an output signal based on the input signal. Further, the operational power consumption of each cell is computed using power which is consumed at the time of charging or discharging the load capacitance of each cell. That is, cell power consumption is computed using the general equation Q=CV, where Q is a charge, C is the load capacitance, and V is a voltage. Generally, this equation is used because the charge may be taken as the sum of the current over a predetermined time.

For a cell having an internal memory, such as a sequential circuit, an input terminal condition with respect to a status change of the internal memory, as well as an input terminal condition with respect to the input-output relation, should be taken into consideration in calculating the current consumption characteristic of each cell. For a cell having an internal memory, the output signal may not vary even when the input signal has changed. Therefore, an input terminal condition for such a case should also be considered in computing the current consumption characteristics of each cell.

The reduction both in the load capacitance of cells and the power consumption due to the recent miniaturization of semiconductor circuits now demands consideration not only of the current consumption caused by charging and discharging the load capacitance of each cell, but also on the current consumption inside each cell. It is also often necessary to consider the case where the input voltage supplied from an external unit differs from the internal voltage of a cell or the case of conflicts caused by the mutual connection of the output terminals of a plurality of cells.

Accordingly, when current consumption characteristics of the individual cells are conventionally computed, a logic simulation of the semiconductor circuit is executed. Logic simulation of a semiconductor circuit having a huge number of cells may, therefore, take a considerable amount of time to determine current consumption.

SUMMARY OF THE INVENTION

Broadly speaking, the present invention relates to a system for calculating current consumption characteristics of cells based on the status changes of the internal memories of the cells.

The invention also relates to a system for calculating current consumption characteristics of cells where the time needed for logic simulation of a semiconductor circuit is able to be shortened. The present invention can be implemented in numerous ways including as a system, an apparatus and a method.

As a system for calculating a current consumption characteristic of a cell having a plurality of input terminals, at least one internal memory and at least one output terminal, an embodiment of the invention includes: a static simulation unit for receiving at least schematic information about the cell and executing static simulation of the cell using the schematic information, thereby generating a simulation result which is a combination of signal values of the plurality of input terminals, a status of the at least one internal memory, and a signal value of the at least one output terminal; a truth table generator for generating a truth table using the simulation result; an input terminal condition setting unit for setting an operation condition of the cell using the truth table, the operation condition includes individual signal values of the plurality of input terminals, a status of the at least one internal memory, and a signal value of the at least one output terminal, and the operation condition meets a condition under which either the signal value of the at least one output terminal or the status of the at least one internal memory changes in accordance with the changing of an input signal supplied to one input terminal; a measuring circuit adding unit for generating measuring circuit information about a measuring circuit to be added to the cell to measure a consumed current of the cell; a circuit simulation unit for executing circuit simulation of the cell using the operation condition and the measuring circuit information, thereby providing a summation result for the consumed current of the cell in the operation condition; and a cell characteristic defining unit for defining a current consumption characteristic of the cell using the summation result. Preferably, the system further includes a transistor reconstructing circuit for reconstructing the cell so as to include only operating transistors.

As a method for calculating a current consumption characteristic of a cell having a plurality of input terminals, at least one internal memory and at least one output terminal, an embodiment of the invention includes the operations of: receiving at least schematic information about the cell and executing static simulation of the cell using the schematic information; generating a simulation result which is a combination of signal values of the plurality of input terminals, a status of the at least one internal memory, and a signal value of the at least one output terminal; generating a truth table using the simulation result; setting an operation condition of the cell using the truth table, the operation condition includes individual signal values of the plurality of input terminals, a status of the at least one internal memory, and a signal value of the at least one output terminal, and the operation condition meets a condition under which either the signal value of the at least one output terminal or the status of the at least one internal memory changes in accordance with the changing of an input signal supplied to one input terminal; generating measuring circuit information about a measuring circuit to be added to the cell to measure a consumed current of the cell; executing circuit simulation of the cell using the operation condition and the measuring circuit information, thereby providing a summation result for the consumed current of the cell in the operation condition; and determining current consumption of the cell using the summation result.

Other aspects and advantages of the invention will become apparent from the following description, taken in conjunction with the accompanying drawings, illustrating by way of example the principles of the invention.

BRIEF DESCRIPTION OF THE DRAWINGS

The invention, and advantages thereof, may best be understood by reference to the following description of the presently preferred embodiments together with the accompanying drawings in which.

DETAILED DESCRIPTION OF THE PREFERRED EMBODIMENTS

Figure 1:
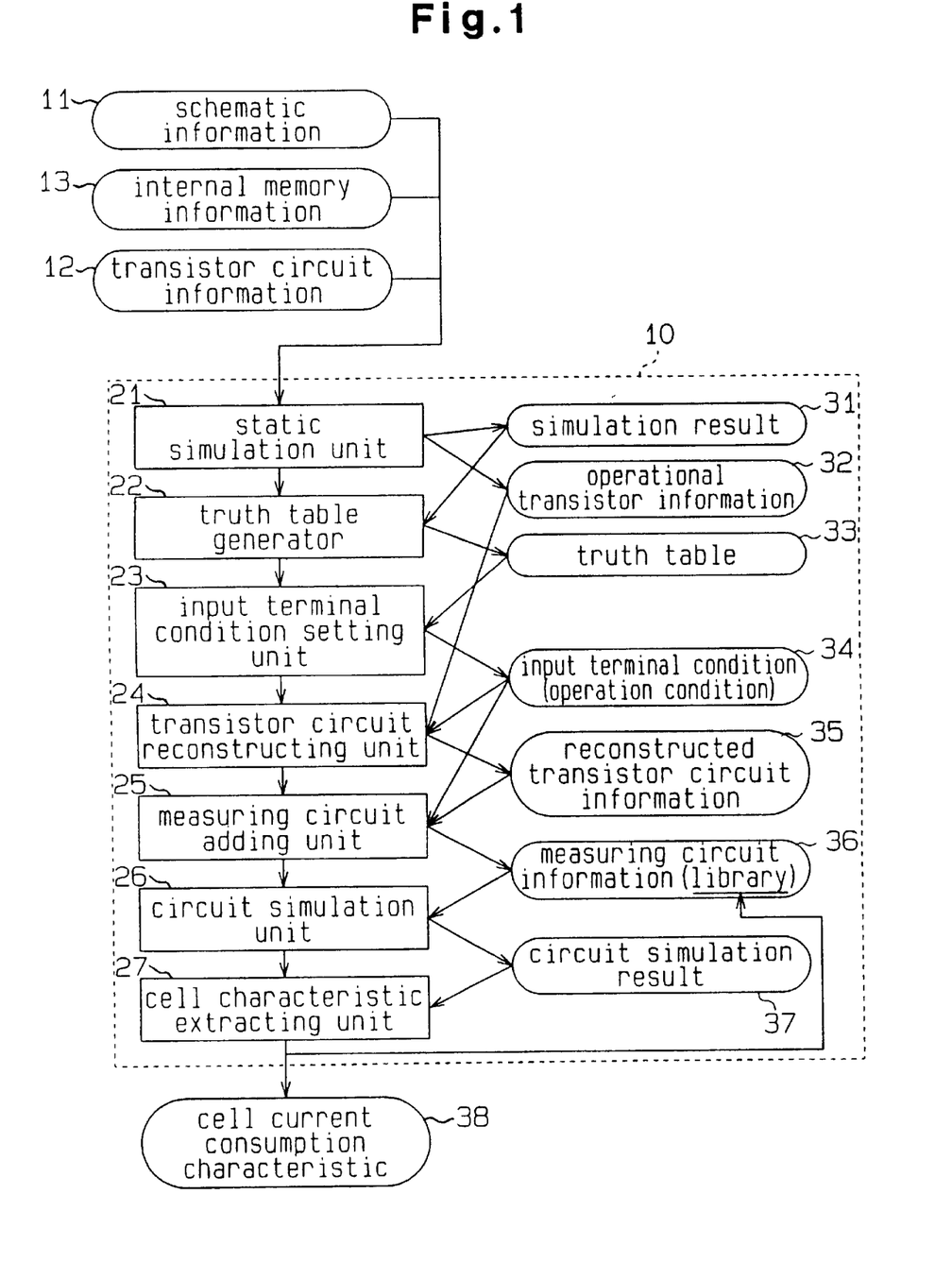
FIG. 1 is a block diagram illustrating a system for calculating current consumption characteristics of cells according to one embodiment of the invention.

A system for calculating current consumption characteristics of cells according to one embodiment of the present invention will now be described referring to the accompanying drawings. FIG. 1 is a block diagram illustrating a cell current consumption characteristic calculating system 10. The calculating system 10 comprises a static simulation unit 21, a truth table generator 22, an input terminal condition setting unit 23, a transistor circuit reconstructing unit 24, a measuring circuit adding unit 25, a circuit simulation unit 26 and a cell characteristic extracting unit 27.

Each of a plurality of cells that constitute a semiconductor circuit is a functional block which has a plurality of transistors, interconnection lines connected to the terminals of the individual transistors, an input terminal for receiving a signal supplied from an external unit, and an output terminal for outputting a signal. For example, those cells include a NAND gate 41 shown in FIG. 3A, a NOR gate 51 shown in FIG. 5A, and an OAI (OR+AND+inverter) cell 61 shown in FIG. 7A.

The static simulation unit 21 receives schematic information 11 of each cell or transistor circuit information 12 and internal memory information 13. The schematic information 11 includes information about a plurality of transistors in a cell, information about the internal net for connecting the terminals of the individual transistors, and information about every input terminal and every output terminal of each cell. The internal memory information 13 includes information about data retainment in a cell having an internal memory, such as a sequential circuit.

The static simulation unit 21 preferably performs static simulation using the schematic information 11 (or the transistor circuit information 12) to provide a simulation result 31. Static simulation is preferably executed based on all of the combinations of signal values for all the input terminals and output terminals of each cell. When the internal memory information 13 is given for the cell to be simulated, the simulation unit 21 provides the simulation result 31 based on the combination of signal values of the input and output terminals and the status of the internal memory. The simulation unit 21 further generates operational transistor information 32 in accordance with the combination of the signal values of the input and output terminals of a cell.

For instance, a data (D-type) flip-flop as a cell has a data terminal D, a clock input terminal CK, output terminals Q and XQ, and internal memories M1 and M2 for retaining data. For the data flip-flop, static simulation is performed in consideration of all the combinations ($2^4$=16) of the signal values of the data terminal D and the clock terminal CK and the status of the internal memories M1 and M2. In this case, the simulation result 31 includes data on the status of the internal memories M1 and M2.

Figure 2:
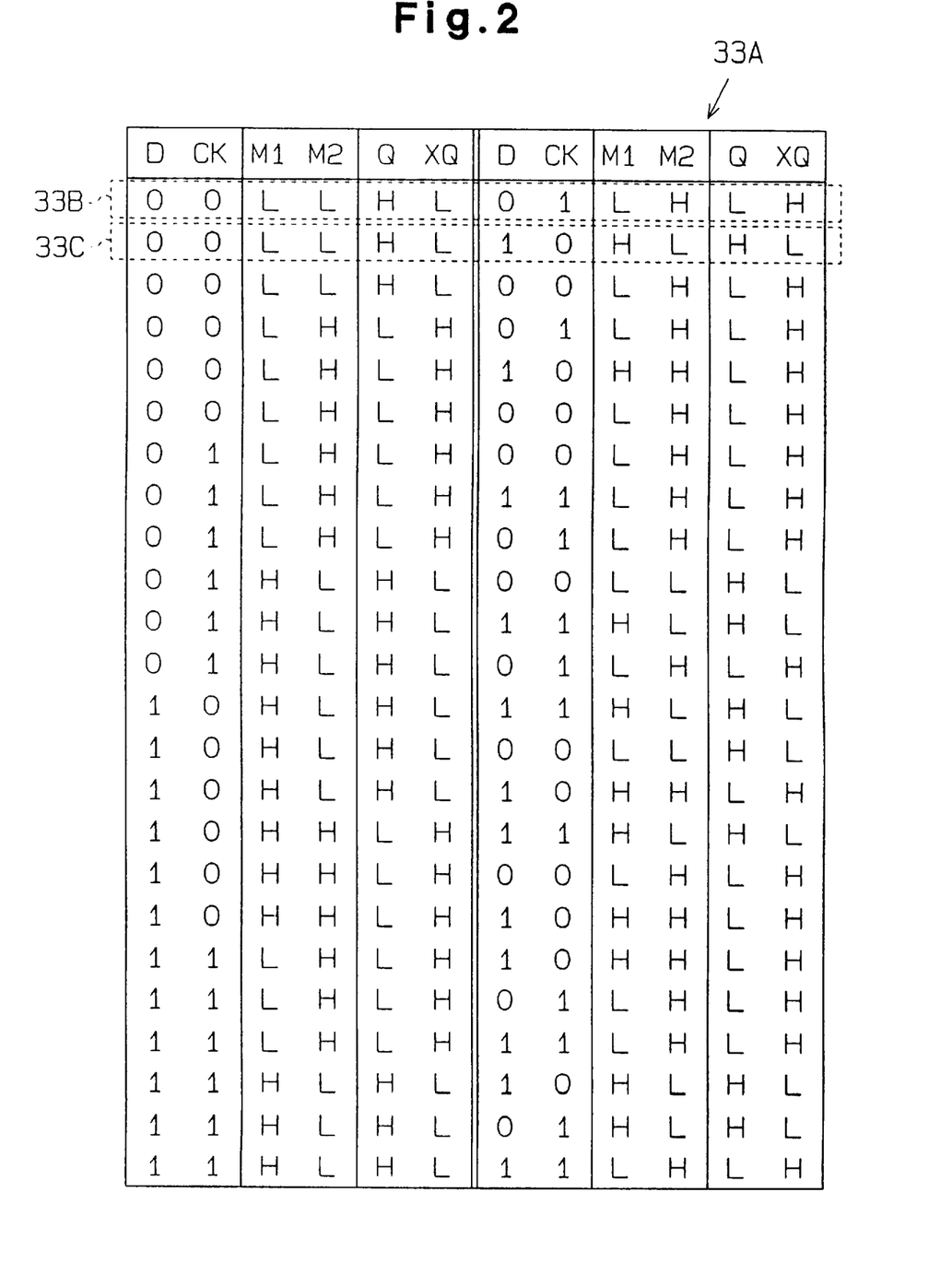
FIG. 2 is a diagram exemplifying a truth table generated by the calculating system in FIG. 1.

The truth table generator 22 receives the simulation result 31 from the static simulation unit 21, and generates a truth table 33 in consideration of all the signal value combinations of every input terminal of a cell and the status of the internal memories. FIG. 2 depicts a truth table 33A which is generated based on the simulation results of the above-exemplified data flip-flop.

The input terminal condition setting unit 23 preferably receives the truth table 33 from the truth table generator 22, and generates an input terminal condition (hereinafter called "operation condition") 34 that indicates the combination of the signal values of the input terminals which change the status of each internal memory or the signal values of the output terminals. In the truth table 33A illustrated in FIG. 2, for example, an operation condition 33B which changes the signal values of the output terminals is expressed by D (0), CK (0→1), M1 (L), M2 (L→H), Q (H→L) and XQ (L→H). An operation condition 33C which changes the status of the internal memory M1 is expressed by D (0→1), CK (0), M1 (L→H), M2 (L), Q (H) and XQ (L).

The transistor circuit reconstructing unit 24 preferably receives the operational transistor information 32 from the static simulation unit 21 and the operation condition 34 from the input terminal condition setting unit 23. Using the operational transistor information 32 and the operation condition 34, the reconstructing unit 24 reconstructs a transistor circuit with only those transistors constituting a target cell that operate in accordance with the operation condition 34 and generate reconstructed transistor circuit information 35.

The reconstruction of a transistor circuit will now be described with reference to FIGS. 3 to 8.

Figure 3A:
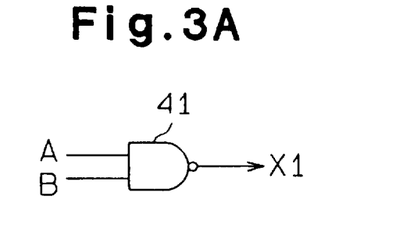
FIG. 3A is a logic circuit diagram showing a NAND gate as a cell.
Figure 3B:
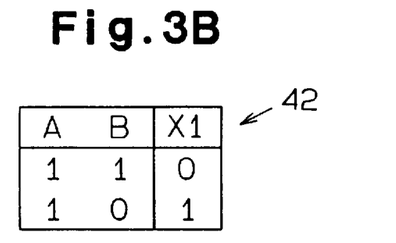
FIG. 3B is a diagram illustrating the operation condition of the NAND gate generated by the calculating system.

FIG. 3A shows a NAND gate 41 as a cell which has two input terminals A and B and an output terminal X1. FIG. 3B shows an operation condition 42 of the NAND gate 41. In this operation condition, as the signal value of the input terminal B changes to 0 (L-level) from 1 (H-level), the signal value of the output terminal X1 changes to 1 from 0.

Figure 4A:
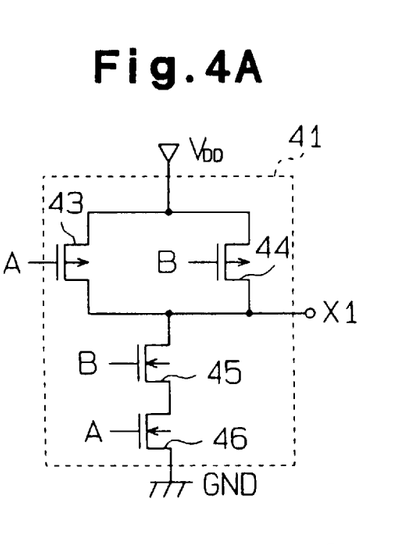
FIG. 4A is a diagram showing a NAND gate before reconstruction by the calculating system.

As shown in FIG. 4A, the NAND gate 41 before reconstruction has two pMOS transistors 43 and 44 and two nMOS transistors 45 and 46. The pMOS transistors 43 and 44 both have sources connected to a high-potential power supply $V_{DD}$ and drains connected to the output terminal X1. The nMOS transistors 45 and 46 are connected in series between the output terminal X1 and a low-potential power supply (ground) GND. The pMOS transistor 43 and the nMOS transistor 46 have gates connected to the input terminal A. The pMOS transistor 44 and the nMOS transistor 45 have gates connected to the input terminal B.

Figure 4B:
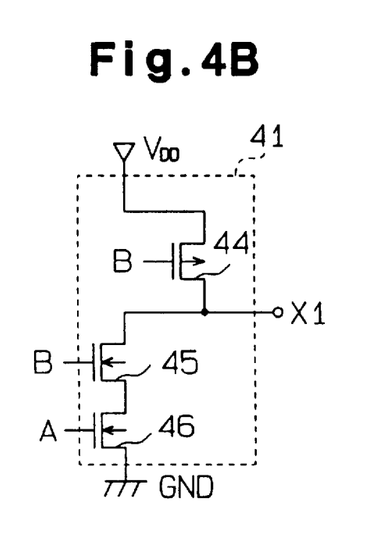
FIG. 4B is a logic circuit diagram showing a reconstructed NAND gate.
Figure 4C:
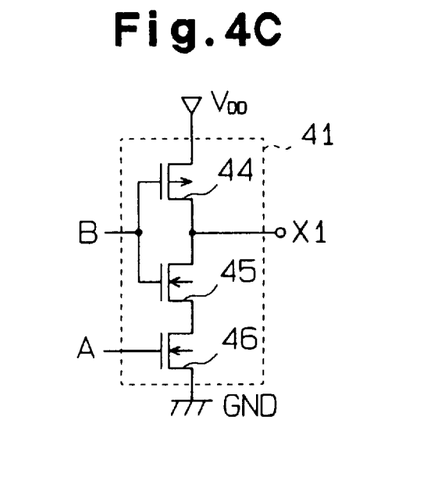
FIG. 4C is an equivalent circuit diagram of the circuit in FIG. 4B.

In the operation condition 42 shown in FIG. 3B, while the signal value of the input terminal B has changed to 0 from 1, the signal value of the input terminal A stays unchanged at 1. Therefore, the pMOS transistor 43 is normally disabled (off) and the nMOS transistor 46 is normally enabled (on). When the signal value of the input terminal B is 1, the pMOS transistor 44 is turned off and the nMOS transistor 45 is turned on. When the signal value of the input terminal B is 0, the pMOS transistor 44 is turned on and the nMOS transistor 45 is turned off. Therefore, the pMOS transistor 43 which is not enabled is omitted and the NAND gate 41 is reconstructed with only the pMOS transistor 44 and the nMOS transistors 45 and 46 as shown in FIG. 4B. FIG. 4C shows an equivalent circuit of the NAND gate 41 in FIG. 4B.

Figure 5A:
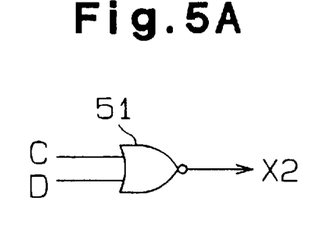
FIG. 5A is a circuit diagram showing a NOR gate as a cell.
Figure 5B:
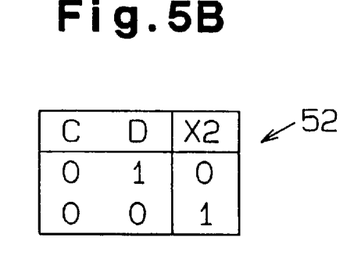
FIG. 5B is a diagram illustrating the operation condition of the NOR gate generated by the calculating system.

FIG. 5A shows a NOR gate 51 as a cell having two input terminals C and D and an output terminal X2. FIG. 5B shows an operation condition 52 of the NOR gate 51. In this operation condition, as the signal value of the input terminal D changes to 0 from 1, the signal value of the output terminal X2 changes to 1 from 0.

Figure 6A:
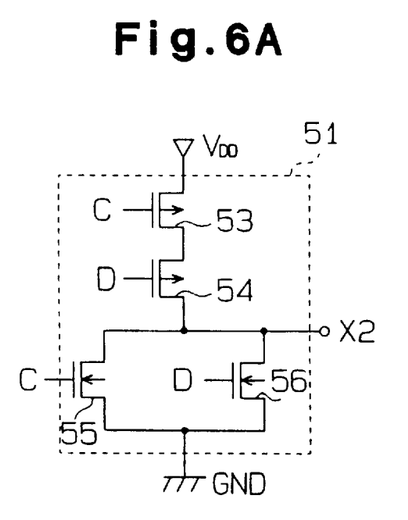
FIG. 6A is a diagram showing a NOR gate before reconstruction by the calculating system.

As shown in FIG. 6A, the NOR gate 51 before reconstruction has two pMOS transistors 53 and 54 and two nMOS transistors 55 and 56. The pMOS transistors 53 and 54 are connected in series between the high-potential power supply $V_{DD}$ and the output terminal X2. The nMOS transistors 55 and 56 both have drains connected to the output terminal X2 and sources connected to the ground GND. The pMOS transistor 53 and the nMOS transistor 55 have gates connected to the input terminal C. The pMOS transistor 54 and the nMOS transistor 56 have gates connected to the input terminal D.

Figure 6B:
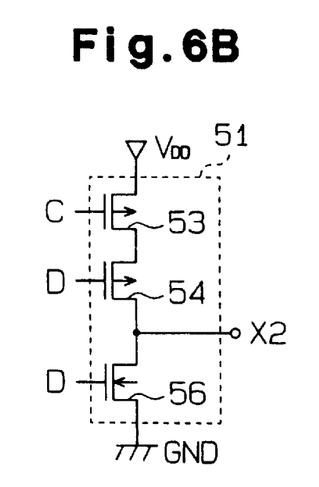
FIG. 6B is a circuit diagram showing a reconstructed NOR gate.
Figure 6C:
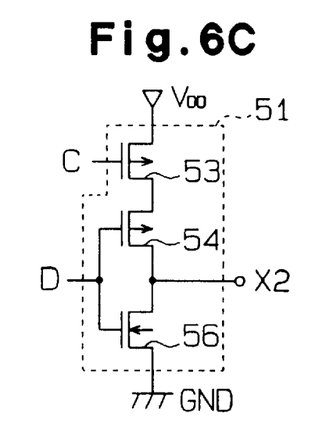
FIG. 6C is an equivalent circuit diagram of the circuit in FIG. 6B.

In the operation condition 52 shown in FIG. 5B, while the signal value of the input terminal D changes to 0 from 1, the signal value of the input terminal C remains unchanged at 0. Therefore, the pMOS transistor 53 is normally on and the nMOS transistor 55 is normally off. When the signal value of the input terminal D is 1, the pMOS transistor 54 is turned off and the nMOS transistor 56 is turned on. When the signal value of the input terminal D is 0, the pMOS transistor 54 is turned on and the nMOS transistor 56 is turned off. Therefore, the pMOS transistor 55 which is not enabled is omitted and the NOR gate 51 is reconstructed with only the pMOS transistors 53 and 54 and the nMOS transistor 56 as shown in FIG. 6B. FIG. 6C shows an equivalent circuit of the NOR gate 51 in FIG. 6B.

Figure 7A:
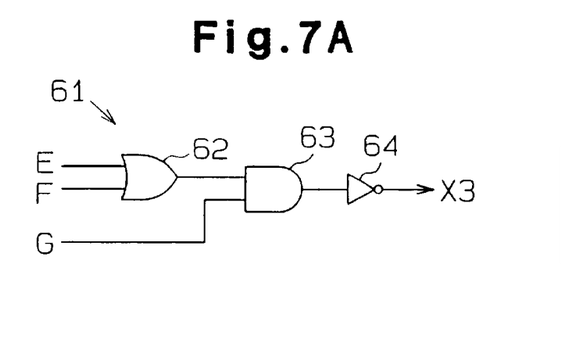
FIG. 7A is a logic circuit diagram of an OAI cell.
Figure 7B:
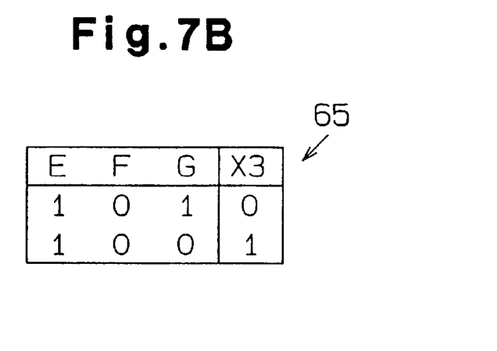
FIG. 7B is a diagram illustrating the operation condition of the OAI cell generated by the calculating system.

FIG. 7A shows an OAI cell 61 which comprises an OR gate 62, an AND gate 63 and an inverter 64. The OAI cell 61 has three input terminals E, F and G and an output terminal X3. The OR gate 62 has two input terminals, respectively connected to the input terminals E and F, and an output terminal. The AND gate 63 has a first input terminal connected to the output terminal of the OR gate 62, a second input terminal connected to the input terminal G, and an output terminal. The inverter 64 has an input terminal connected to the output terminal of the AND gate 63 and an output terminal connected to the output terminal X3. FIG. 7B shows an operation condition 65 of the OAI cell 61. In this operation condition, as the signal value of the input terminal G changes to 0 from 1, the signal value of the output terminal X3 changes to 1 from 0.

Figure 8A:
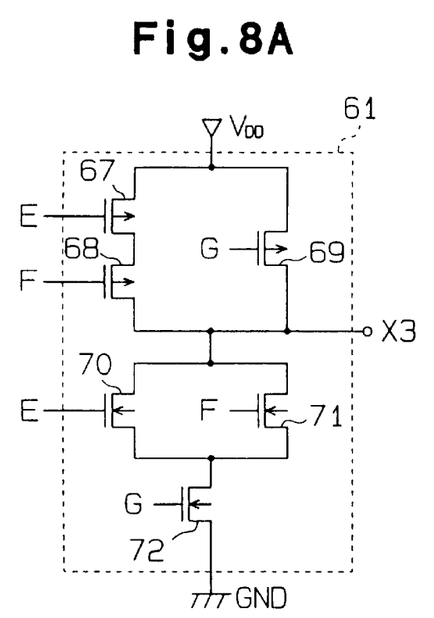
FIG. 8A is a diagram showing an OAI cell before reconstruction by the calculating system.

As shown in FIG. 8A, the OAI cell 61 has three pMOS transistors 67, 68 and 69 and three nMOS transistors 70, 71 and 72. The pMOS transistors 67 and 68 are connected in series between the high-potential power supply $V_{DD}$ and the output terminal X3, and the pMOS transistor 69 is connected in parallel to the pMOS transistors 67 and 68 between the high-potential power supply $V_{DD}$ and the output terminal X3. The nMOS transistors 70 and 71 both have drains connected to the output terminal X3 and sources connected via the nMOS transistor 72 to the ground GND. The pMOS transistor 67 and the nMOS transistor 70 have gates connected to the input terminal E. The pMOS transistor 68 and the nMOS transistor 71 have gates connected to the input terminal F. The pMOS transistor 69 and the nMOS transistor 72 have gates connected to the input terminal G.

Figure 8B:
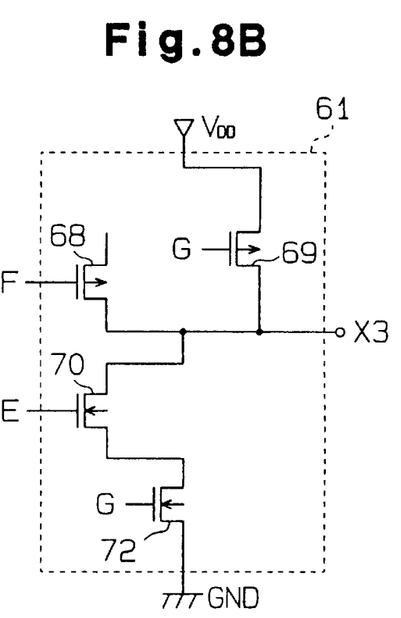
FIG. 8B is a diagram showing a reconstructed OAI cell.
Figure 8C:
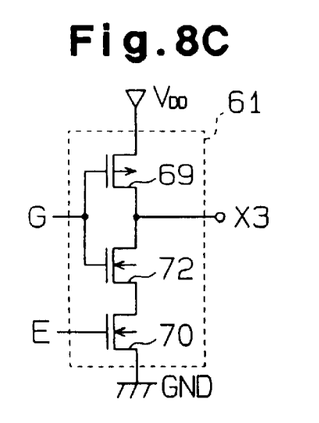
FIG. 8C is a diagram showing another reconstructed OAI cell.

In the operation condition 65 shown in FIG. 7B, while the signal value of the input terminal G changes to 0 from 1, the signal value of the input terminal E stays at 1 and the signal value of the input terminal F remains unchanged at 0. Therefore, the pMOS transistor 67 and the nMOS transistor 71 are normally off and the nMOS transistor 70 and the pMOS transistor 68 are normally on. When the signal value of the input terminal G is 1, the pMOS transistor 69 is turned off and the nMOS transistor 72 is turned on. When the signal value of the input terminal G is 0, the pMOS transistor 69 is turned on and the nMOS transistor 72 is turned off. Therefore, the pMOS transistor 67 and the nMOS transistor 71 which are not enabled are omitted and the OAI cell 61 is reconstructed with the pMOS transistors 68 and 69 and the nMOS transistors 70 and 72 as shown in FIG. 8B. Since the source of the pMOS transistor 68 in the circuit in FIG. 8B is floating, this pMOS transistor 68 is further omitted, so that the OAI cell 61 is reconstructed with only the pMOS transistor 69 and the nMOS transistors 70 and 72 as shown in FIG. 8C.

Referring again to FIG. 1, the measuring circuit adding unit 25 receives the operation condition 34 from the input terminal condition setting unit 23 and reconstructed transistor circuit information 35 from the transistor circuit reconstructing unit 24. The adding unit 25 affixes information on the circuit for measuring the consumed current of the associated cell (transistor circuit) to the reconstructed transistor circuit information 35 to generate measuring circuit information 36. The generation of this measuring circuit information will now be discussed with reference to FIGS. 9 to 12.

Figure 9:
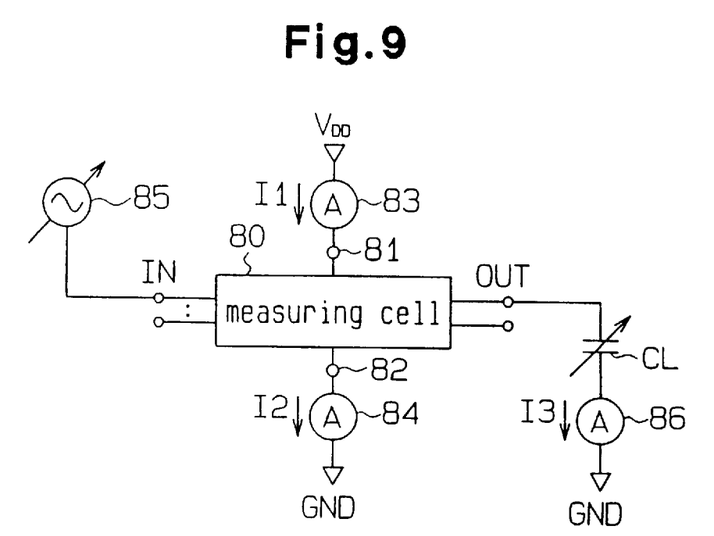
FIG. 9 is a diagram depicting the addition of a circuit for measuring a cell's consumed current by the application of a voltage according to each operation condition.

As shown in FIG. 9, using a plurality of operation conditions (i.e., one after another), a first ammeter 83 is connected between a power terminal 81 of a measuring cell 80 (reconstructed NAND gate, NOR gate or OAI cell) and the high-potential power supply $V_{DD}$, and a second ammeter 84 is connected between another power terminal 82 and the ground GND. The first ammeter 83 is provided to measure a current I1 which flows from the voltage supply $V_{DD}$ when the measuring cell 80 operates. The second ammeter 84 is provided to measure a current I2 which flows to the ground GND when the measuring cell 80 operates. An input waveform 85 is applied to the path's input terminal in the measuring cell 80 and a voltage corresponding to a predetermined signal value is applied to the remaining input terminals excluding the path's input terminal in accordance with each operation condition. Further, a load capacitor CL is connected to the path's output terminal with a third ammeter 86 connected between the load capacitor CL and the ground GND. The third ammeter 86 is provided to measure a charge/discharge current I3 for the load capacitor CL when the measuring cell 80 operates.

In this embodiment, a plurality of input waveforms 85 which vary at various ratios are continuously applied in order to measure their influence of change in the input waveform 85 on the current consumption characteristics of the measuring cell. Further, a plurality of load capacitors having various capacitances are selectively used in order to measure their influence on the current consumption characteristics according to the capacitance of the load capacitor CL.

Figure 10:
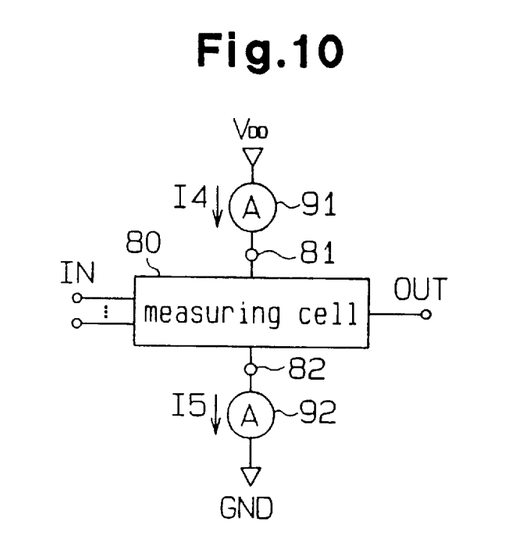
FIG. 10 is a diagram depicting the addition of a circuit for measuring a cell's consumed current by the application of a voltage according to each input condition.

As shown in FIG. 10, using a plurality of input terminal conditions (i.e., one after another), a first ammeter 91 is connected between the power terminal 81 of the measuring cell 80 and the voltage supply $V_{DD}$, and a second ammeter 92 is connected between another power terminal 82 and the ground GND. Each input terminal condition indicates a signal value in the operation condition, which is associated with an input terminal. The first ammeter 91 is provided to measure a current I4 which flows from the voltage supply $V_{DD}$ when the measuring cell 80 is in operation. The second ammeter 92 is provided to measure a current I5 which flows to the ground GND when the measuring cell 80 is in operation. A voltage corresponding to the signal value is applied to all the input terminals of the measuring cell 80 in accordance with the individual input terminal conditions.

Figure 11:
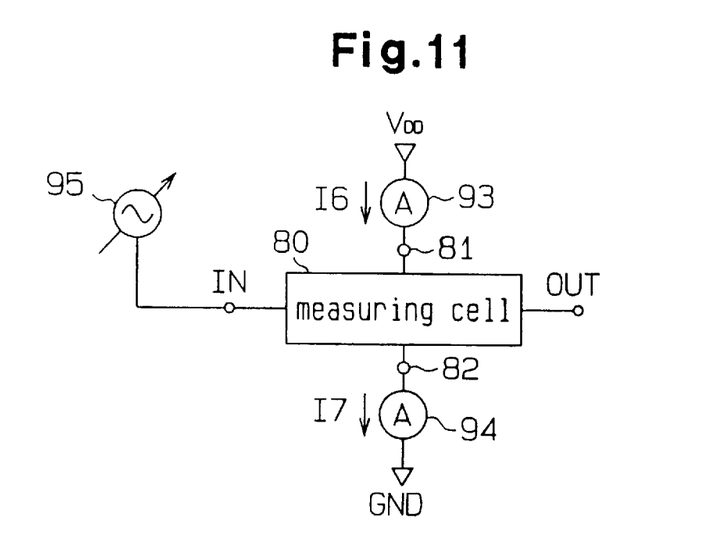
FIG. 11 is a diagram illustrating the addition of a circuit for measuring a cell's consumed current by the application of a predetermined input signal.

As shown in FIG. 11, a first ammeter 93 is connected between the power terminal 81 of the measuring cell 80 and the voltage supply $V_{DD}$, and a second ammeter 94 is connected between another power terminal 82 and the ground GND. The first ammeter 93 is provided to measure a current I6 which flows from the voltage supply $V_{DD}$ when the measuring cell 80 is in operation. The second ammeter 94 is provided to measure a current I7 which flows to the ground GND when the measuring cell 80 is in operation. An input signal 95 having a voltage which changes between the voltage level of the ground GND and the voltage level of the voltage supply $V_{DD}$ is applied to all the input terminals of the measuring cell 80 (only one input terminal is shown in the diagram for ease of description).

Figure 12:
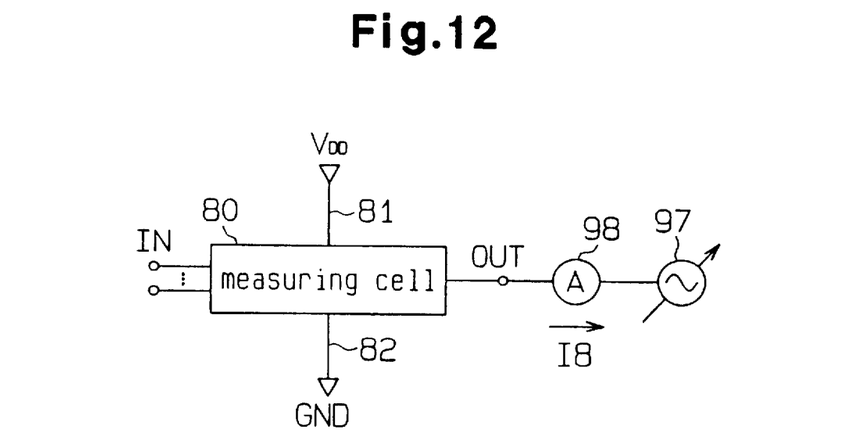
FIG. 12 is a diagram illustrating the addition of a circuit for measuring a cell's consumed current by the application of a predetermined external signal.

As shown in FIG. 12, using a plurality of input terminal conditions (i.e., one after another), the power terminal 81 of the measuring cell 80 is connected to the voltage supply $V_{DD}$, and another power terminal 82 is connected to the ground GND. A voltage corresponding to the signal value is applied to all the input terminals of the measuring cell 80 in accordance with the individual input terminal conditions. The path's output terminal is connected via an ammeter 98 to an external signal 97 whose voltage changes between the voltage level of the ground GND and the voltage level of the voltage supply $V_{DD}$. The ammeter 98 is provided to measure a current I8 which flows from the voltage supply $V_{DD}$ or flows to the ground GND, when the measuring cell 80 is in operation.

Referring again to FIG. 1, the circuit simulation unit 26 receives the measuring circuit information 36 from the measuring circuit adding unit 25 and executes circuit simulation to provide a circuit simulation result 37. At this time, in accordance with the individual operation conditions, the circuit simulation unit 26 measures the currents I4 and I5 for the measuring cell 80 shown in FIG. 10 using the ammeters 91 and 92. In accordance with the individual operation conditions, the circuit simulation unit 26 further measures the currents I1 and I2 with respect to the input waveform 85 using the ammeters 83 and 84 and measures the charge/discharge current I3 using the ammeter 86 while changing the capacitance of the load capacitor CL for the measuring cell 80 shown in FIG. 9. With regard to the measuring cell 80 shown in FIG. 11, the circuit simulation unit 26 applies the input signal 95 to the individual input terminals (only one input terminal is shown in the diagram for ease of description) and measures the currents I6 and I7, which change in accordance with various voltages of the input signal 95, using the ammeters 93 and 94. As regards the measuring cell 80 shown in FIG. 12, the circuit simulation unit 26 applies the external signal 97 to the individual output terminals which may conflict with one another (only one output terminal shown in the diagram for ease of description) and measures the current I8, which changes in accordance with various voltages of the external signal 97, using the ammeter 98.

The cell characteristic extracting unit 27 generates a cell current consumption characteristic 38 as follows by using the circuit simulation result 37 from the circuit simulation unit 26. The cell characteristic extracting unit 27 then sets the generated cell current consumption characteristic 38 into a library.

(1) The currents I4 and I5 are defined as the normal consumed currents in the input terminal condition of the measuring cell 80.

(2) The charges Q1 and Q2 of the measuring cell 80 are determined by integrating the individual current values which are obtained by subtracting the normal consumed currents I4 and I5 from the currents I1 and I2 respectively. The charge Q3 of the measuring cell 80 is obtained by integrating the charge/discharge current I3. When the signal value of the output terminal decreases in the operation condition, a value obtained by subtracting the charge Q3 from the charge Q2 is defined as the amount of the through current and the amount of the leak current. The amount of the through current and the amount of the leak current depend on the load capacitance CL and the gentle change in the input waveform 85. When the signal value of the output terminal increases in the operation condition, a value obtained by subtracting the charge Q3 from the charge Q1 is defined as the amount of the through current and the amount of the leak current.

(3) The currents I6 and I7 are defined as the normal consumed currents which depend on the value of the input signal 95 to be applied to the input terminals of the measuring cell 80.

(4) When the output terminal of the measuring cell 80 conflicts with the output terminal of another cell, the current I8 is defined as the normal consumed current which depends on the external signal 97 according to the individual input terminal conditions.

In this embodiment, the current consumption characteristics of each cell are calculated in accordance with the operation condition 34, which is expressed in terms of the combination of the signal value of each input terminal and the signal value of the output terminal or the status of the internal memory that changes according to each input signal to be supplied to a single input terminal. Accordingly, the current consumption characteristics of each cell may be calculated specifically based on the status of each internal memory.

Further, the transistor circuit reconstructing unit 24 reconstructs a transistor circuit only with the transistors which operate in accordance with the operation condition 34. Advantageously, the number of transistors in a target cell for circuit simulation may be reduced. Accordingly, this shortens the time required for circuit simulation and thus shortens the time needed to calculate the cell current consumption characteristic. In addition, when the same transistor structure is acquired by reconstructing cells whose transistor structures differ from one another, the simulation results for those cells become the same. It is therefore sufficient to perform circuit simulation a single time for a plurality of cells which provide an identical result. This circuit simulation can further shorten the time needed for the calculation of the cell current consumption characteristic.

Although only one embodiment of the present invention has been described herein, it should be apparent to those skilled in the art that the present invention may be embodied in many other specific forms without departing from the spirit or scope of the invention. Therefore, the present examples and embodiment are to be considered as illustrative and not restrictive and the invention is not to be limited to the details given herein, but may be modified within the scope and equivalence of the appended claims.

What is claimed is:

1. A current consumption characteristic calculating system, comprising:
    a static simulation unit that receives schematic information about a cell and executes a static simulation of the cell based on the schematic information to generate a simulation result, the cell having a plurality of input terminals, an internal memory and an output terminal, and the simulation result including signal values of the plurality of input terminals, a status of the internal memory, and a signal value of the output terminal;
    a truth table generator that generates a truth table based on the simulation result;
    an input terminal condition setting unit that sets an operation condition for the cell based on the truth table, the operation condition including signal values of the plurality of input terminals, the status of the internal memory, a signal value of the output terminal and wherein at least one of the signal value of the output terminal and the status of the internal memory changes based on a change in the input signal supplied to a specified input terminal of the plurality of input terminals;
    a measuring circuit adding unit that generates measuring circuit information about a measuring circuit to be added to said cell to measure a consumed current of said cell;
    a transistor reconstructing circuit that reconstructs the cell to include only transistors operating under the operation condition;
    a circuit simulation unit for executing a circuit simulation of the reconstructed cell, based on the operation condition and the measuring circuit information, to provide a summation result of the consumed current of the cell in the operation condition; and
    a cell characteristic defining unit that defines a current consumption characteristic of the cell based on the summation result.

2. The system according to claim 1, wherein the cell has first and second power terminals;
    wherein the measuring circuit information includes information about:
        connection of the first power terminal to a high-potential power supply and connection of the second power terminal to a low-potential power supply,
        application of a variable input signal value to the specified input terminal in accordance with the operation condition, resulting in a variable output signal value at the output terminal;
        connection of the output terminal having the variable output signal value to the low-potential power supply via a load capacitor,
        and application of a predetermined signal value to each of the plurality of input terminals except the specified input terminal; and
    wherein said circuit simulation unit measures currents flowing to the first and second power terminals and a charge/discharge current flowing to the load capacitor based on the operation condition and the measuring circuit information.

3. The system according to claim 1, wherein the cell has first and second power terminals;
    wherein the measuring circuit information includes information about:
        connection of the first power terminal to a high-potential power supply and connection of the second power terminal to a low-potential power supply, and
        application, to each of the input terminals, of a voltage corresponding to a signal value thereof in accordance with the signal values of the plurality of input terminals designated in the operation condition; and
    wherein said circuit simulation unit measures currents flowing to the first and second power terminals based on the operation condition and the measuring circuit information.

4. The system according to claim 1, wherein the cell has first and second power terminals;
    wherein the measuring circuit information includes information about:
        connection of the first power terminal to a high-potential power supply and connection of the second power terminal to a low-potential power supply, and
        application of a voltage signal to the plurality of input terminals, the voltage signal changing from a voltage of the low-potential power supply to a voltage of the high-potential power supply; and
    wherein said circuit simulation unit measures currents flowing to the first and second power terminals based on the operation condition and the measuring circuit information.

5. The system according to claim 1, wherein the cell has first and second power terminals;
    wherein the measuring circuit information includes:
        connection of the first power terminal to a high-potential power supply and connection of the second power terminal to a low-potential power supply, and application of a voltage signal to the output terminal, the voltage signal changing from a voltage of the low-potential power supply to a voltage of the high-potential power supply based on the operation condition; and wherein the circuit simulation unit measures a current flowing to the output terminal based on the operation condition and the measuring circuit information.

6. The system according to claim 1, wherein:

the cell comprises a plurality of transistors, and the simulation result includes information about whether each transistor has operated during the static simulation.

7. The system according to claim 1, wherein said measuring circuit adding unit further generates additional information about a measuring circuit to be added to the reconstructed cell to measure a consumed current of the cell.

8. The system according to claim 1, wherein the cell comprises a plurality of transistors, said system further comprising a transistor reconstructing circuit that reconstructs the cell prior to the circuit simulation, the reconstructed cell including only transistors operating in accordance with the operation condition.

9. A current consumption characteristic calculating method, comprising the steps of:

receiving schematic information about a cell having a plurality of input terminals, an internal memory, and an output terminal and executing static simulation of the cell based on the schematic information;

generating a simulation result including respective signal values of the plurality of input terminals, a status of the internal memory, and a signal value of the output terminal;

generating a truth table based on the simulation result;

setting an operation condition of the cell based on the truth table, the operation condition including:

designation of respective signal values of the plurality of input terminals, a status of the internal memory, a signal value of the output terminal, and wherein the signal value of the internal memory changes in accordance with a change of an input signal supplied to a specified one of the plurality of input terminals;

generating measuring circuit information about a measuring circuit to be added to the cell to measure consumed current of the cell;

reconstructing the cell to include only transistors operating under the operation condition;

executing a circuit simulation of the cell, based on the operation condition and the measuring circuit information, to provide a summation result for the consumed current of the cell in the operation condition; and determining a current consumption of the cell based on the summation result.

10. A computer-readable medium encoded with a program for calculating a current consumption characteristic, said program comprising the functions of:

receiving schematic information about a cell having a plurality of input terminals, an internal memory, and an output terminal and executing static simulation of the cell in accordance with the schematic information;

generating a simulation result including respective signal values of the plurality of input terminals, a status of the internal memory, and a signal value of the output terminal;

generating a truth table based on the simulation result;

setting an operation condition of the cell based on the truth table, the operation condition including:

designation of respective signal values of the plurality of input terminals, a status of the internal memory, a signal value of the output terminal, and wherein the signal value of the internal memory changes based on a change of an input signal supplied to a specified one of the plurality of input terminals;

generating measuring circuit information about a measuring circuit to be added to the cell to measure consumed current of the cell;

reconstructing the cell to include only transistors operating under the operation condition;

executing a circuit simulation of the cell, based on the operation condition and the measuring circuit information, to provide a summation result for the consumed current of the cell in the operation condition; and determining a current consumption of the cell based on the summation result.

* * * * *